United States Patent [19]

Batterman

[11] Patent Number: 4,587,448
[45] Date of Patent: May 6, 1986

[54] SIGNAL TRANSITION DETECTION CIRCUIT

[75] Inventor: Eric P. Batterman, Philadelphia, Pa.

[73] Assignee: RCA Corporation, Princeton, N.J.

[21] Appl. No.: 517,841

[22] Filed: Jul. 27, 1983

[51] Int. Cl.[4] .................. H03K 5/153; H03K 5/12; H03K 6/04
[52] U.S. Cl. .................... 307/517; 307/518
[58] Field of Search ............ 307/517, 263, 268, 358, 307/360, 361; 328/164, 55, 56, 109; 364/481

[56] References Cited

U.S. PATENT DOCUMENTS

| | | | |
|---|---|---|---|
| 3,778,543 | 12/1973 | Lowry | 178/5.4 R |
| 4,016,511 | 4/1977 | Ramsay et al. | 333/138 |
| 4,050,084 | 9/1977 | Rossi | 358/31 |
| 4,241,310 | 12/1980 | Kerr | 328/119 |
| 4,280,133 | 7/1981 | Kato | 358/8 |
| 4,281,347 | 7/1981 | Tschannen | 358/166 |
| 4,288,872 | 9/1981 | Tamburelli | 375/14 |
| 4,307,413 | 12/1981 | Takeuchi et al. | 358/31 |
| 4,334,237 | 6/1982 | Reitmeier et al. | 358/36 |
| 4,334,244 | 6/1982 | Chan et al. | 358/166 |
| 4,352,162 | 9/1982 | Nyuji et al. | 364/724 |
| 4,355,326 | 10/1982 | Lee | 358/37 |
| 4,424,458 | 1/1984 | Buck et al. | 307/361 |

FOREIGN PATENT DOCUMENTS 2939578 4/1981 Fed. Rep. of Germany .
2087191A 5/1982 United Kingdom .

OTHER PUBLICATIONS

J. Rossi, "Digital Television Image Enhancement", *Journal of the SMPTE*, vol. 84, Jul. 1975, pp. 545-551.
Y. Faroudja et al., "Digital and Analog Enhancement Techniques", *SMPTE Journal*, vol. 87, Jan. 1978, pp. 24-28.

*Primary Examiner*—John S. Heyman
*Assistant Examiner*—K. Ohralik
*Attorney, Agent, or Firm*—Eugene M. Whitacre; Paul J. Rasmussen; Clement A. Berard, Jr.

[57] ABSTRACT

A signal transition detection circuit detects a transition which satisfies predetermined criteria related to magnitude and time. These criteria include that the magnitude of a group of signal samples preceeding the transition and a group thereof following the transition each be relatively close in magnitude and that the difference between the magnitudes of signal samples preceeding and following the transition be at least a predetermined amount. Further, detection criteria are included to test for smoothness and monotonicity of the transition and to exclude detection of transitions having magnitude changes exceeding a predetermined amount.

20 Claims, 9 Drawing Figures

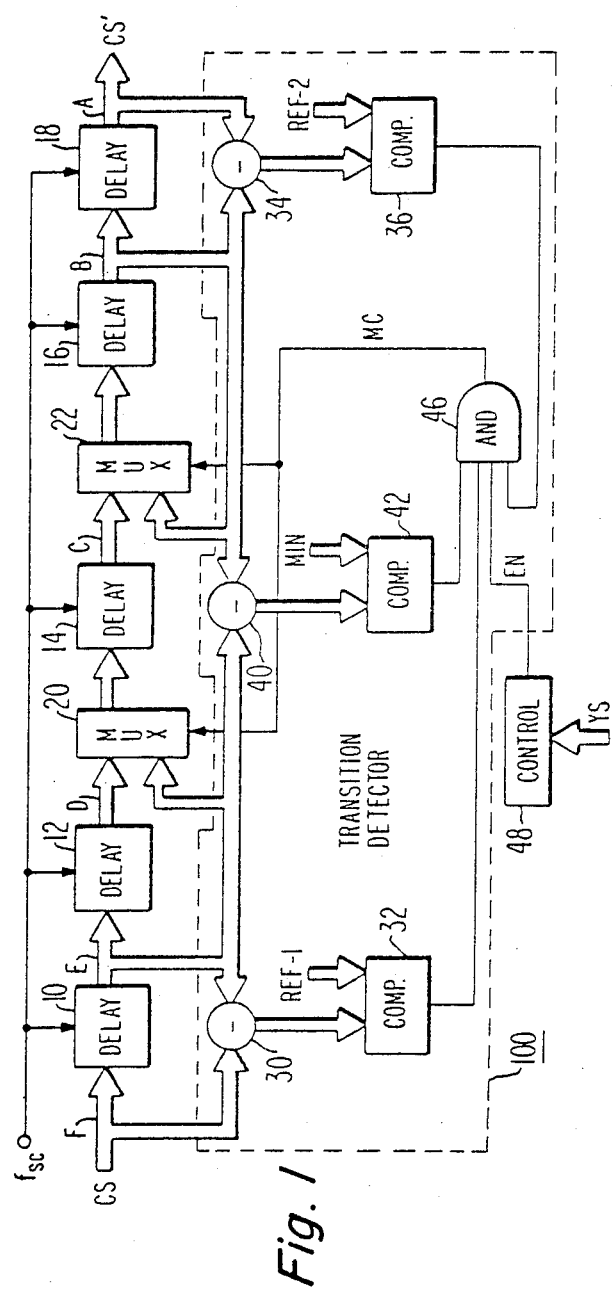
Fig. 1
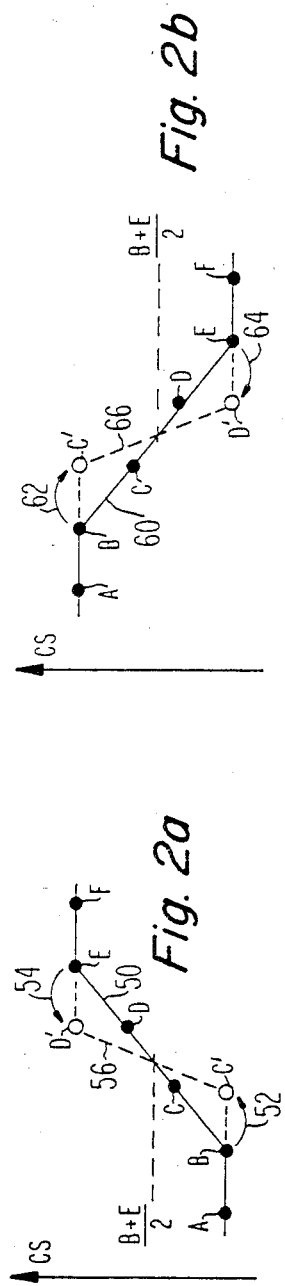
Fig. 2a
Fig. 2b

SIGNAL TRANSITION DETECTION CIRCUIT

The present invention relates to signal processing circuitry and, in particular, to circuitry for detecting signal transitions which satisfy predetermined criteria.

In the processing of electrical signals, it is often necessary to detect particular types of transitions so that various processing operations can respond thereto. For television (TV) signal processing, the detection of transitions is usefully employed in conjunction with signal transition enhancement circuits, peaking circuits, ghost cancellation circuits and adaptive filtering circuits.

A simple signal transition detector which merely detects a change in signal level is not adequate for use with the aforementioned TV signal processing circuits because it will respond to transients (momentary or short duration disturbances) as well as to transitions (substantial level changes of significant duration). Thus, it is desired that only the signal transitions which satisfy certain additional criteria be detected. For a chrominance signal transition enhancement circuit, for example, it may be desired that only transitions which are characterized by a level change within predetermined limits and relatively constant levels immediately preceeding and following that level change be detected. Such transitions occur, for example, at the edge of an object at which limited chrominance signal rise and fall times can cause poor color fidelity. This effect is particularly evident when the object has a well-defined edge which the high bandwidth (4.2 MHz) luminance signal can reproduce but which the lower bandwidth (0.5 MHz) chrominance signals cannot, and further when the color of the object is substantially different from that of the background.

Thus, there is a need for circuitry which will detect signal transitions which satisfy certain predetermined criteria. Accordingly, the signal detection circuit of the present invention comprises first and second detectors for detecting magnitude differences within respective first and second groups of signal samples which are less than first and second values, a third detector for detecting a magnitude difference between two signal samples which are greater than a third value, and a fourth detector responsive to the first, second and third detectors for developing a detection indication.

In the drawing:

FIG. 1 is a schematic diagram in block diagram form of apparatus including an embodiment of the present invention;

FIGS. 2a and 2b are diagrams illustrating signals in the apparatus of FIG. 1; and FIGS. 3-8 are schematic diagrams of modifications to, and alternate embodiments of, portions of the apparatus of FIG. 1.

Figure 3:
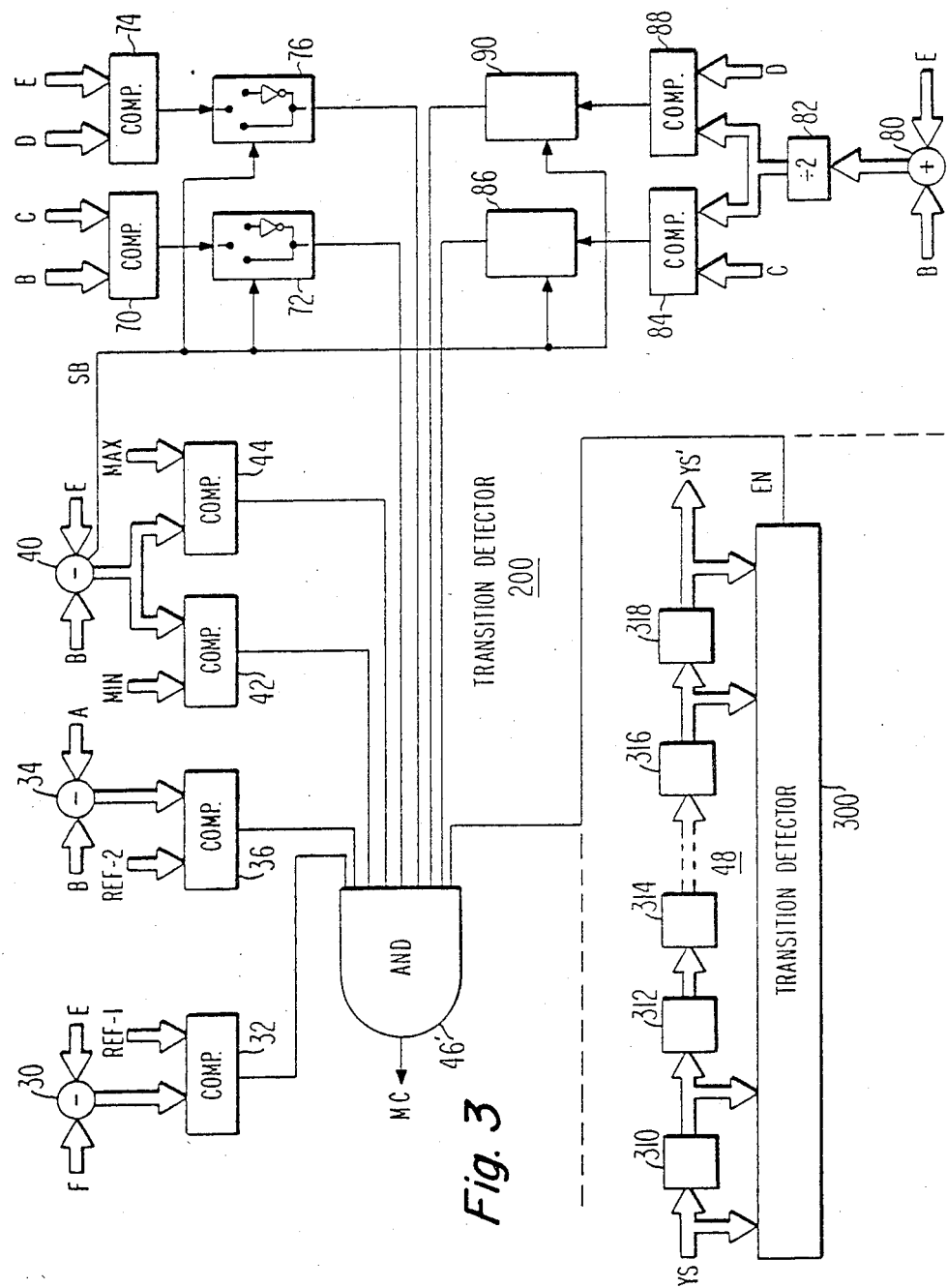

Although the signals in the following description are referred to as digital signals, it is understood that the present invention is satisfactorily practiced with many different types of signals, for example, sampled data signals of both analog and digital types, and analog signals. In the drawing, broad arrows illustrate signal paths for multi-bit, parallel digital signals whereas line arrows illustrate signal paths for single-bit or serial digital signals, or for analog signals.

FIG. 1 illustrates a signal transition enhancement circuit including a transition detector adapted for processing digital chrominance signals in a television receiver having digital signal processing circuitry producing digital chrominance signals CS and for further processing of digital chrominance signals CS'.

In the following description, the operation of delay stages 10, 12, 14, 16 and 18 and of MUX's 20 and 22 to effect enhancement of rise and fall time is described first, and the operation of transition detector 100 is described thereafter.

Assuming initially that multiplexers (MUX) 20 and 22 couple signals at locations D and C to their respective outputs, input signals CS are successively delayed by cascade-coupled delay stages 10, 12, 14, 16 and 18 so that output signals CS' are simply input signals CS delayed in time. Each of delay stages 10, 12, 14, 16 and 18 is, for example, an eight-bit parallel latch responsive to a clocking signal $f_{sc}$. Clocking signal $f_{sc}$ has a repetition rate related to the color subcarrier frequency, i.e., about 3.58 MHz in the NTSC TV system. Thus, CS' is delayed in time from CS by five cycles of clocking signal $f_{sc}$.

When transitions of signals CS occur which satisfy certain predetermined criteria of magnitude and rise or fall time, transition detector 100 develops and applies control signal MC to MUXs 20 and 22 so that MUXs 20 and 22 selectively couple inputs of ones of the delay stages to inputs of others of the delay stages. Specifically, MUX 20 couples the input of delay stage 12 to the input of delay stage 14 and uncouples the output of delay stage 12 therefrom, and MUX 22 couples the input of delay stage 18 to the input of delay stage 16 and uncouples the output of delay stage 14 therefrom.

Consider, for example, the time sequence of samples A, B, C, D, E, F of signal CS shown in FIG. 2a as forming a transition from a lower magnitude to a higher magnitude (positive-going transition). The time represented by FIG. 2a is that in which the time sequence of samples of CS have been clocked through delay stages 10, 12, 14, 16 and 18 so that the sample-designating letters in FIG. 2a correspond to the signal-path-designating letters in FIG. 1. That is, signal CS is at this time at the magnitude indicated by sample F and was at the magnitude indicated by sample A five cycles of clocking signal $f_{sc}$ previously. Solid line 50 connects the samples A-F so as to illustrate the rise time of the transition represented by the samples A-F.

Consider further that at this time this sequence of samples have magnitudes such that detector 100 develops control signal MC activating MUXs 20 and 22 as described above. Then, MUX 20 substitutes sample E for sample D at the input to delay stage 14 and MUX 22 substitutes sample B for sample C at the input to delay stage 16. These substitutions are respectively indicated by arrows 54 and 52 and the substituted samples E and B are respectively designated as D' and C' in FIG. 2a. At the next occurring cycle of clocking signal $f_{sc}$, the samples B, C', D', E, F are respectively latched in delays 18, 16, 14, 12 and 10, and detector 100 removes control signal MC because the transition detection criteria are no longer satisfied. In response to further cycles of $f_{sc}$, signal CS' will include the modified sequence of samples A, B, C', D', E, F (i.e. the magnitudes A, B, B, E, E, F in sequence) which has a transition having enhanced (decreased) rise time. Phantom line 56 connects the samples in the modified sequence so as to illustrate the enhanced rise time of the transition represented thereby.

By way of further example, consider the sequence of samples of signal CS shown in FIG. 2b as forming a transition from a higher magnitude to a lower magnitude (negative-going transition), illustrated by line 60. In accordance with the operation described above in relation to FIG. 2a, substitutions 62 and 64 are made by MUXs 20 and 22, respectively, in response to control signal MC so that the modified sequence A, B, B, E, E, F of signal CS' representing an enhanced fall time, illustrated by phantom line 66, is produced.

Transition detector 100, and the predetermined criteria by which occurrence of a transition is detected, will now be described. A transition of a waveform is a change of instantaneous amplitude from one amplitude level to another amplitude level, and can be described in terms of the difference between the levels and the time required for the change of level. For sampled data, of which digital signals are an example, a transition can be described in terms of the magnitudes of samples or groups of samples, and the number of samples over which a magnitude change occurs.

Detector 100 detects a transition when the sampled data signal magnitudes are relatively close in magnitude for each of two groups of consecutive successive samples, and when the difference in magnitudes as between non-consecutive samples is substantial. Specifically, in a sequence of six consecutive successive samples, a transition is detected when (1) the first and second samples (first group of consecutive samples) are relatively close in magnitude to each other, (2) the fifth and sixth samples (second group of consecutive samples) are relatively close in magnitude to each other, and (3) when the magnitudes of the second and fifth samples (two non-consecutive samples) substantially differ from each other. These criteria establish that the first, second, fifth and sixth samples are not part of a transition, and that a substantial transition occurs between the two groups of samples, such as is illustrated by FIGS. 2a and 2b.

Transition detector 100 of FIG. 1 includes subtractor 30 which develops the difference between the magnitudes of consecutive samples E and F which is applied to comparator 32. Comparator 32 produces an output to apply an enabling level to one input of AND gate 46 when the difference $|E-F|$ is less than the relatively small value REF-1. Similarly, subtractor 34 develops the difference between consecutive samples A and B and comparator 36 applies an enabling level to a second input of AND gate 46 when the difference $|A-B|$ is less than the relatively small value REF-2. In addition, subtractor 40 develops from non-consecutive samples B and E the difference $|B-E|$ which, if it is greater than a substantial minimum value MIN, causes comparator 42 to apply an enabling level to a third input of AND gate 46. Assuming that enabling signal EN is present, coincidence at the inputs of AND gate 46 produces control signal MC to cause MUXs 20 and 22 to respectively apply sample E to the input of delay stage 14 and sample B to the input of delay stage 16 as described above. These criteria for detection of a transition are summarized in Table I.

TABLE I

| No. | Elements | Test Criteria at AND Gate 46 |
|---|---|---|
| 1. | 30, 32 | $|E-F|$ < REF-1 |
| 2. | 34, 36 | $|A-B|$ < REF-2 |
| 3. | 40, 42 | $|B-E|$ > MIN |
| 4. | 48 | EN = 1 |

Control device 48 develops enabling signal EN which enables and disables detector 100. Control device 48 is, for example, a transition detector developing enabling signal EN in response to transitions in luminance signals YS. It is noted that signals CS and YS are related in time because they are component signals representing the same picture. It is understood that control device 48 can be omitted.

Transition detector 200 shown in FIG. 3 is a modification of detector 100 in which additional detection criteria must be satisfied to produce control signal MC. The additional detection criteria ensure that the transition will only be enhanced if it is a relatively smooth and monotonic transition, thereby avoiding the loss of valid, relatively higher frequency sample information. This is achieved by additional detection criteria requiring that the transition magnitude difference between the second and fifth samples not exceed a maximum value, and that the magnitudes of the third and fourth samples are intermediate the average of the magnitudes of the second and fifth samples and the magnitudes of the second and fifth samples, respectively.

Detector 200 includes subtractors 30, 34 and 40, and comparators 32, 36 and 42 which correspond to like numbered elements of detector 100 described above. Comparator 44 applies an enabling level to an input of AND gate 46' when the difference $|B-E|$ developed by subtractor 40 is less than a maximum value MAX, which is itself greater than the minimum value MIN. Subtractor 40 also develops a sign bit SB which indicates whether the transition is positive- or negative-going and which is employed to simplify the comparator structure for testing the additional detection criteria.

Criteria indicating smoothness and monotonicity of a transition are tested by comparators 70, 74, 84 and 88 as follows. Comparator 70 compares samples B and C, the result of which comparison is selectively inverted by controllable inverter block 72 in response to sign bit SB. Thus, one input of AND gate 46' is enabled when the criterion B<C is satisfied for positive-going transitions and when the criterion B>C is satisfied for negative-going transitions. Similarly, comparator 74 and controllable inverter block 76 enable one input of AND gate 46' when the criterion D<E is satisfied for positive-going transitions and when the criterion D>E is satisfied for negative-going transitions. This ensures that the magnitudes of samples C and D are intermediate those of samples B and E providing a first indication of monotonicity.

Adder circuit 80 and divide-by-two circuit 82 develop the average of the magnitudes of samples B and E, which average is indicated by the phantom lines at level (B+E)/2 in FIGS. 2a and 2b. For sampled analog signals, circuits 80 and 82 are a resistive network; for digital signals, circuit 80 is an adder and circuit 82 is a bit shifter implemented by wired connections. Comparator 84 and controllable inverter block 86 enable an input of AND gate 46' when the criterion $C<\frac{1}{2}|B+E|$ is satisfied for positive-going transitions and when $C>\frac{1}{2}|B+E|$ is satisfied for negative-going transitions. Similarly, comparator 88 and controllable inverter block 90 enable an input of AND gate 46' when the criterion $D>\frac{1}{2}|B+E|$ is satisfied for positive-going transitions and when $D<\frac{1}{2}|B+E|$ is satisfied for negative-going transitions. This ensures that the magnitude of sample C is intermediate the average level of B and E and the magnitude of sample B, and that the magnitude of sample D is intermediate the average level and the magnitude of sample E, thereby providing a further indication of monotonicity.

AND gate 46' develops control signal MC in response to coincidence of signals at all of its inputs. These criteria for detection are summarized in Table II.

TABLE II

| No. | Elements | Test Criteria at AND Gate 46' | |
|---|---|---|---|
| | | Positive-Going Transition | Negative-Going Transition |
| 1. | 30, 32 | $|E-F| < $ REF-1 | $|E-F| < $ REF-1 |
| 2. | 34, 36 | $|A-B| < $ REF-2 | $|A-B| < $ REF-2 |
| 3. | 40, 42 | $|B-E| > $ MIN | $|B-E| > $ MIN |
| 4. | 40, 44 | $|B-E| < $ MAX | $|B-E| < $ MAX |
| 5. | 70, 72 | B < C | B > C |
| 6. | 74, 76 | D < E | D > E |
| 7. | 80, 82, 84, 86 | $C < \frac{1}{2}|E+B|$ | $C > \frac{1}{2}|B+E|$ |
| 8. | 80, 82, 88, 90 | $D > \frac{1}{2}|E+B|$ | $D < \frac{1}{2}|B+E|$ |
| 9. | 48 | EN = 1 | EN = 1 |

For an eight-bit digital chrominance signal having values corresponding to the decimal values zero through 255, the following nominal comparison levels are satisfactory: REF-1=8, REF-2=8, MIN=48, MAX=255.

The remaining portion of FIG. 3 shows control circuit 48 comprising a luminance signal transition detection system. Luminance signals YS are successively delayed by delaying stages 310, 312, 314, 316 and 318 and are applied to transition detector 300. Detector 300 is, for example, of like structure to that of either detectors 100 or 200 as described above except that the control signal therefrom is applied to AND gate 46' as enabling signal EN. It is noted that delaying stages 310–318 may be a delay line existing as part of an FIR or comb filter within the luminance processing circuitry.

Figure 4:
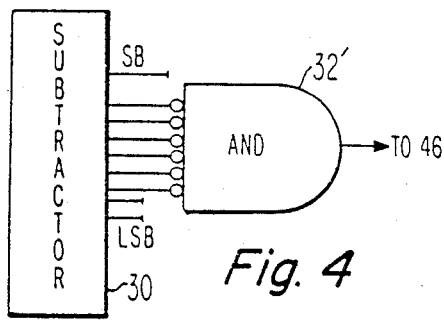
Figure 5:
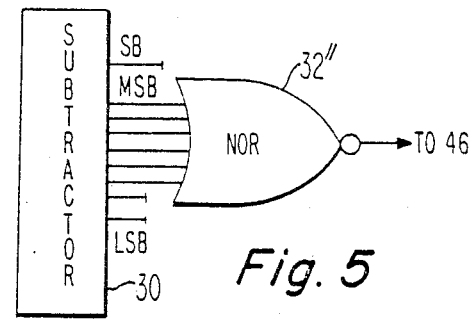

FIGS. 4 and 5 show embodiments useful, for example, as a substitute for comparators 32, 36 or 44 of FIGS. 1 and 2. AND gate 32' of FIG. 4 responds to coincidence of a selected number of the more significant bits (MSB) of the difference produced by subtractor 30 to apply an enabling level to AND gate 46 or 46'. NOR gate 32" of FIG. 4 responds to a selected number of the MSBs of the difference produced by subtractor 30 to apply an enabling level to AND gate 46 or 46'. The level of reference level REF-1 provided by gate 32' or 32" is given by $[2^N-1]$ where N is the number of lesser significant bits (LSB) not connected thereto and is listed in Table III.

TABLE III

| AND Gate 32' and NOR Gate 32": | | |
|---|---|---|
| MSBs Applied | LSBs Not Applied | Value of REF-1 |
| 8 | 0 | 0 |
| 7 | 1 | 1 |
| 6 | 2 | 3 |
| 5 | 3 | 7 |
| 4 | 4 | 15 |
| 3 | 5 | 31 |
| 2 | 6 | 63 |
| 1 | 7 | 127 |

Figure 6:
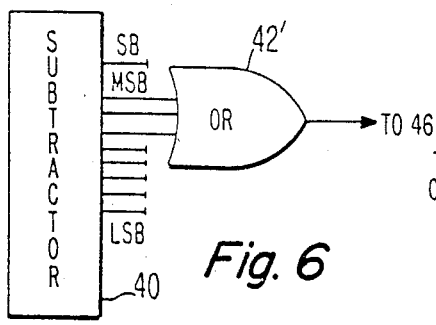

FIG. 6 shows an embodiment useful, for example, as a substitute for comparator 42 of FIG. 2. OR gate 42' responds to any one of the MSBs of the difference produced by subtractor 40 to apply an enabling level to AND gate 46'. The level of reference MIN is given by $[2^N-1]$ where N is the number of LSBs not connected to OR gate 42'.

Figure 7:
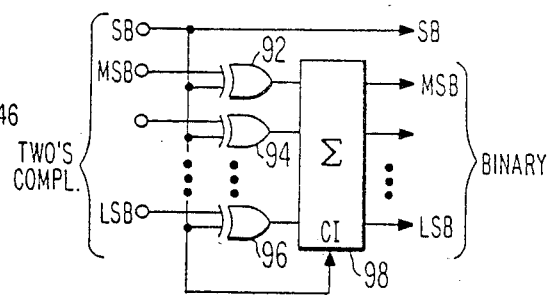

Modifications are contemplated within the scope of the present invention set forth in the claims following. For example, subtractor 80, divide circuit 82, comparator 88 and inverter block 90 of FIG. 2 can be eliminated and samples C and D applied directly to comparator 84. This provides a monotonicity indication where the criterion C<D is satisfied for positive-going transitions and when C>D is satisfied for negative-going transitions. Further, the comparator arrangements of FIGS. 4, 5 and 7 illustrate that the absolute value of the difference magnitude is obtained for signed-binary digital number signals by excluding the sign bit SB from the comparison.

It will be appreciated that the number of delaying stages 10, 12, 14 . . . employed, the repetition rate of clocking signal $f_{sc}$, the ones of the succesively delayed samples of signals CS applied to detectors 100 and 200, and the location of MUXs 20 and 22 in the cascade of delaying stages all influence the rise and fall time detection limits and the degree to which the rise and fall times are enhanced. For example, to enhance the transitions of luminance signal samples produced at four times the color subcarrier frequency (i.e. $4f_{sc} \approx 14.32$ MHz for the NTSC system), a greater number of delaying stages are required. Moreover, the numbers of samples in the groups thereof can be greater or lesser than the two samples (A, B and E, F) described herein, and the number of samples between those groups can be greater or lesser than the two samples (C, D) described herein.

It will be further appreciated that transitions faster than those illustrated in FIGS. 2a and 2b can be enhanced so long as there is at least one signal sample within the transition. I.e., so long as the two samples compared to detect a transition are non-consecutive. For example, the circuit of FIG. 1 can be modified so that signal samples E and C are compared by subtractor 40 and comparator 42 to detect a transition in which case delay stages 12 and 14 and multiplexer 20 are the principal elements and only the substitutions 54 and 64 of FIGS. 2a and 2b are effected. Thus, MUX 22 can be eliminated and delay stage 14 coupled directly to delay stage 16.

While the transition enhancement described herein has referred to decreasing the rise and fall times of transitions, the present invention is also useful to increase rise and fall times. In this modification, MUX 20 is interposed before delay stage 12 and receives signal samples E and D at its inputs, MUX 22 is interposed before delay stage 18 and receives signal samples C and B at its inputs, delay stage 12 is coupled to delay stage 14, and delay stage 14 is coupled to delay stage 16. Thus, detector 100 produces control signal MC to cause sample C to be substituted for sample B and sample D to be substituted for sample E.

By way of further example, controllable inverter blocks 72, 76, 86 and 90 can be eliminated and multiplexers can be added to reverse the inputs to each of comparators 70, 74, 84 and 88. Still further, other digital number systems can be processed by the circuitry of the present invention by insertion of converters, such as the twos-complement-to-binary converter of FIG. 7, at appropriate locations within transition detectors 100 and 200.

What is claimed is:
1. A signal detection circuit for developing a detection indication comprising:
    a source of signal samples representing a time varying signal means coupled to said source for simultaneously providing a plurality of said signal samples each successively delayed in time with respect to a given sample;

first detecting means responsive to a first group of said signal samples for developing a first indication when the magnitude of the samples in said first group differ by less than a first predetermined value;

second detecting means responsive to two of said signal samples for developing a second indication when the magnitudes of said two signals samples differ by more than a second predetermined value; and third detecting means for developing said detection indication in response to said first and second indications.

2. A signal detection circuit for developing a detection indication comprising:

a source of signal samples representing a time varying signal means coupled to said source for simultaneously providing a plurality of said signal samples each successively delayed in time with resecpt to a given sample;

first detecting means responsive to a first group of said signal samples for developing a first indication when the magnitude of the samples in said first group differ by less than a first predetermined value;

second detecting means responsive to a second group of said signal samples for developing a second indication when the magnitude of the samples in said second group differ by less than a second predetermined value;

third detecting means responsive to two of said signal samples for developing a third indication when the magnitudes of said two signal samples differ by more than a third predetermined value; and fourth detecting means for developing said detection indication in response to said first, second and third indications.

3. The circuit of claim 2 wherein said first detecting means comprises:

combining means for developing an indication of the difference between the magnitudes of two signal samples of said first group; and comparing means for developing said first indication when the magnitude of said difference indication is less than said first predetermined value.

4. The circuit of claim 3 wherein said signal samples are digital signals and wherein said combining means is a digital subtractor.

5. The circuit of claim 4 wherein said comparing means includes an AND gate for detecting coincidence of inverses of a predetermined number of the more significant bits of said difference indication developed by said digital subtractor.

6. The circuit of claim 4 wherein said comparing means includes a NOR gate responsive to a predetermined number of the more significant bits of said difference indication developed by said digital subtractor.

7. The circuit of claim 2 wherein said third detecting means comprises:

combining means for developing an indication of the difference between the magnitudes of said two signal samples; and comparing means for developing said third indication when the magnitude of said difference indication exceeds said third predetermined value.

8. The circuit of claim 7 wherein said signal samples are digital signals and wherein said combining means is a digital subtractor.

9. The circuit of claim 8 wherein said comparing means includes an OR gate responsive to a predetermined number of the more significant bits of said difference indication developed by said digital subtractor.

10. The circuit of claim 2 wherein said fourth detecting means includes an AND gate responsive to coincidence of said first, second and third indications for developing said detection indication.

11. The circuit of claim 2 wherein said first group includes at least two consecutive signal samples and said second group includes at least two consecutive signal samples other than those included in said first group.

12. The circuit of claim 2 wherein said two signal samples include first and second non-consecutive signal samples.

13. The circuit of claim 12 further comprising fifth detecting means for developing a fifth indication when the magnitudes of signal samples intermediate said first and second non-consecutive signal samples are intermediate the magnitudes of said first and second non-consecutive signal samples, and wherein said fourth detecting means is further responsive to said fifth indication for developing said detection indication.

14. The circuit of claim 12 wherein at least two signal samples intervene between said first and second non-consecutive signal samples, further comprising fifth detecting means for developing a fifth indication that the sequence of magnitudes of said first, intervening and second signal samples is monotonic.

15. The circuit of claim 14 wherein said fifth detection means comprises:

means for developing a magnitude value intermediate that of said first and second non-consecutive signal samples;

first means for comparing the magnitude of one of said intervening signal samples to said intermediate magnitude value;

second means for comparing the magnitude of another one of said intervening signal samples to said intermediate magnitude value; wherein said fifth indication includes indications developed by said first means and said second means.

16. A signal detection circuit for developing a detection indication comprising:

a source for providing a plurality of signal samples successively delayed in time;

first detecting means responsive to a first group including at least two consecutive ones of said signal samples for developing a first indication when the magnitude of the samples in said first group differ by less than a first predetermined value;

second detecting means responsive to a second group of said signal samples for developing a second indication when the magnitude of the samples in said second group differ by less than a second predetermined value, said second group including at least two consecutive ones of said signal samples other than those included in said first group;

third detecting means responsive to first and second non-consecutive ones of said signal samples for developing a third indication when the magnitudes of said first and second signal samples differ by more than a third predetermined value, wherein at least one signal sample intervenes between said first and second signal samples;

fourth detecting means for developing a fourth indication that the sequence of magnitudes of said first intervening and second signal samples is monotonic; and fifth detecting means for developing said detection indication in response to said first, second, third and fourth indications.

17. The circuit of claim 16 wherein said fourth detecting means develops said fourth indication when the magnitudes of said signal samples intervening between said first and second non-consecutive signal samples are intermediate the magnitudes of said first and second non-consecutive signal samples.

18. The circuit of claim 16 wherein at least two signal samples intervene between said first and second non-consecutive signal samples, and wherein said fourth detection means comprises:

means for developing a magnitude value intermediate that of said first and second non-consecutive signal samples;

first means for comparing the magnitude of one of said intervening signal samples to said intermediate magnitude value;

second means for comparing the magnitude of another one of said intervening signal samples to said intermediate magnitude value; wherein said fourth indication includes indications developed by said first means and said second means.

19. The circuit of claim 18 wherein said fourth detecting means develops said fourth indication when the magnitudes of said signal samples intervening between said first and second non-consecutive signal samples are intermediate the magnitudes of said first and second non-consecutive signal samples.

20. A signal detection circuit for developing a detection indication comprising:

a source for providing respective pluralities of samples of first and second signals, each successively delayed in time;

first detecting means responsive to a first group of said first signal samples for developing a first indication when the magnitude of the samples in said first group differ by less than a first predetermined value;

second detecting means responsive to a second group of said first signal samples for developing a second indication when the magnitude of the samples in said second group differ by less than a second predetermined value;

third detecting means responsive to two of said first signal samples for developing a third indication when the magnitudes of said two signal samples differ by more than a third predetermined value;

fourth detecting means responsive to a first group of said second signal samples for developing a fourth indication when the magnitude of the samples in said first group differ by less than a fourth predetermined value;

fifth detecting means responsive to a second group of said second signal samples for developing a fifth indication when the magnitude of the samples in said second group differ by less than a fifth predetermined value;

sixth detecting means responsive to two of said second signal samples for developing a sixth indication when the magnitudes of said two signal samples differ by more than a sixth predetermined value; and seventh detecting means for developing said detection indication in response to said first, second, third, fourth, fifth and sixth indications.

* * * * *